(12) United States Patent
Bauer et al.

(10) Patent No.: US 12,720,671 B2
(45) Date of Patent: Aug. 25, 2026

(54) SELECTIVE REMOVAL OF ADHESIVE FROM COVERLAY FOR PRINTED CIRCUIT BOARD INSULATION

(71) Applicant: Rockwell Collins, Inc., Cedar Rapids, IA (US)

(72) Inventors: John A. Bauer, Marion, IA (US); Robert C. Cooney, Janesville, WI (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 161 days.

(21) Appl. No.: 18/407,647

(22) Filed: Jan. 9, 2024

(65) Prior Publication Data

US 2025/0227837 A1 Jul. 10, 2025

(51) Int. Cl.

| | |
|---|---|
| ***H05K 1/02*** | (2006.01) |
| ***H05K 1/11*** | (2006.01) |
| ***H05K 3/00*** | (2006.01) |
| ***H05K 3/28*** | (2006.01) |
| ***H05K 3/3447*** | (2026.01) |
| *H05K 1/181* | (2026.01) |

(52) U.S. Cl.

CPC ........... *H05K 1/0256* (2013.01); *H05K 1/111* (2013.01); *H05K 3/0076* (2013.01); *H05K 3/28* (2013.01); *H05K 3/3447* (2013.01); *H05K 1/181* (2013.01); *H05K 2201/09545* (2013.01); *H05K 2201/09572* (2013.01); *H05K 2201/10303* (2013.01); *H05K 2203/1394* (2013.01)

(58) Field of Classification Search

None

See application file for complete search history.

(56) References Cited

U.S. PATENT DOCUMENTS

| | | | | |
|---|---|---|---|---|
| 6,730,859 B2 * | 5/2004 | Muramatsu | H05K 3/4602 | 174/262 |
| 6,784,374 B2 * | 8/2004 | Ishida | H05K 3/3436 | 361/767 |
| 6,878,884 B2 * | 4/2005 | Momokawa | H05K 3/3447 | 361/779 |
| 2003/0006061 A1 * | 1/2003 | Brinthaupt, III | H05K 3/3447 | 174/255 |
| 2004/0078964 A1 * | 4/2004 | Itou | H05K 3/3452 | 174/250 |
| 2016/0262271 A1 | 9/2016 | Nazarenko et al. | | |
| 2022/0053636 A1 | 2/2022 | Matsuda | | |
| 2022/0117085 A1 | 4/2022 | Higashira et al. | | |
| 2023/0309244 A1 | 9/2023 | Ishida | | |

FOREIGN PATENT DOCUMENTS

| | | |
|---|---|---|
| WO | 2011096293 A1 | 8/2011 |
| WO | 2022137443 A1 | 6/2022 |

* cited by examiner

*Primary Examiner* — Timothy J Thompson

(74) *Attorney, Agent, or Firm* — Millen, White, Zelano & Branigan P.C.; William F. Nixon

(57) ABSTRACT

A circuit board system includes a printed circuit board (PCB) having a first side and a second side opposite the first side. A plurality of plated through holes (PTHs) are defined through the PCB from the first side to the second side. A respective pad is defined at each end of each PTH of the plurality of PTHs. The PCB includes circuit traces electrically interconnecting among the plurality of PTHs for forming PCB circuitry. A coverlay is adhered with an adhesive layer to the first side of the PCB for insulating voltages among the plurality of PTHs.

8 Claims, 2 Drawing Sheets

100, 110
113
112
100
110
102
104
106
116
A
120
118

SELECTIVE REMOVAL OF ADHESIVE FROM COVERLAY FOR PRINTED CIRCUIT BOARD INSULATION

BACKGROUND

1. Field

The present disclosure relates to circuit boards, and more particularly to voltage insulation for circuit boards.

2. Description of Related Art

On printed circuits boards (PCBs), connectors for low current signals have relatively close spacing between conductors. High voltage signals require large spacing between conductors. Electrical spacing is from pad to pad for plated through holes (PTHs) where the connectors are seated, and this spacing is significantly less than the pin-to-pin spacing. There are very limited options for electrically insulating between the plated through hole pads on compliant pin pressed connectors. Applying a vapor deposition conformal coating, for example, Parylene, requires extensive masking to prevent the coating from depositing on the mating surfaces of the contacts. Applying a conformal coating to the PCB, coating the pads and plated through holes, and subsequently pressing the connector through the coating results in a low reliability electrical connection because the compliant contact typically does not pierce the coating to the full depth. The pierced conformal coating can, if dislodged from the plated through hole, become foreign object debris (FOD) and could migrate around the electronics product.

The conventional techniques have been considered satisfactory for their intended purpose. However, there is an ever-present need for improved systems and methods for insulating ever-increasing voltages in PCBs. This disclosure provides a solution for this need.

SUMMARY

A circuit board system includes a printed circuit board (PCB) having a first side and a second side opposite the first side. A plurality of plated through holes (PTHs) are defined through the PCB from the first side to the second side. A respective pad is defined at each end of each PTH of the plurality of PTHs. The PCB includes circuit traces electrically interconnecting among the plurality of PTHs for forming PCB circuitry. A coverlay is adhered with an adhesive layer to the first side of the PCB for insulating voltages among the plurality of PTHs.

A plurality of pin contacts can be included, each pin contact extending through the coverlay and a through bore of a respective one of the PTHs of the plurality of PTHs. None of the adhesive layer need extend into the through bore. Each through bore can be defined along a respective bore axis. The coverlay can include an overhang in each of the plurality of PTHs wherein the coverlay extends radially inward with respect to each bore axis toward the respective pin contact beyond the respective pad. The overhang can define a void in the adhesive layer axially between the PCB and the coverlay relative to the respective bore axis.

The coverlay can be a first coverlay and further comprising a second coverlay adhered to the second side of the PCB. The second coverlay can include an overhang in each of the plurality of PTHs wherein the coverlay extends radially inward toward the respective pin contact beyond the respective pad. The plurality of pin contacts can be compliant, seated within the respective lining of each PTH of the plurality of PTHs with an interference fit.

The plurality of pin contacts can be secured within the respective pad lining each PTH of the plurality of PTHs with a solder joint. An opening through the second coverlay for each pad can be bigger than a corresponding opening through the first coverlay, e.g. so solder can be applied through the plurality of second holes to connect the plurality of pin contacts to the plurality of pads without thermally compromising the second coverlay. The pads lining each PTH of the plurality of PTHs can be spaced apart from one another by as few as 17 thousandths of an inch (0.432 mm).

A method of making a circuit board system includes selectively removing portions of an adhesive layer from a base dielectric of a coverlay. After selectively removing portions of the adhesive layer, the method includes adhering the coverlay onto a first side of a printed circuit board (PCB) such as the PCB described above. The method includes placing a plurality of pin contacts through the coverlay, each pin contact of the plurality of pin contacts extending through the coverlay and a respective one of the PTHs of the plurality of PTHs with the coverlay insulating voltages among the plurality of PTHs.

Selectively removing portions of the adhesive layer can include applying a patterned photoresist layer to at least one of the adhesive layer and/or the base dielectric opposite the adhesive layer wherein the photoresist layer is patterned to leave out the portions of the adhesive layer, plasma etching the portions of the adhesive layer from the base dielectric of the coverlay, and stripping the photoresist layer from the coverlay. Applying the patterned photo resist layer can include applying photoresist to both sides of the coverlay, imaging a pattern onto the photoresist, and removing a portion of the photoresist, leaving the pattern in the photoresist to expose the portions of the adhesive layer to a chemical etchant. Selectively removing portions of an adhesive layer from a coverlay can also include using controlled depth laser skiving to remove the portion of the adhesive from the base dielectric.

The method can include placing a plurality of pin contacts in the plurality of PTHs, respectively, after adhering the coverlay onto the first side of the PCB. Placing the plurality of pin contacts can include piercing the coverlay with the plurality of pin contacts after adhering the coverlay onto the first side of the PCB. The method can include forming a plurality of holes for the plurality of pin contacts through the coverlay prior to adhering the coverlay to the first side of the PCB so the plurality of pin contacts can be placed through the coverlay without piercing the coverlay. The method can include soldering the plurality of pin contacts to the respective pads. The method can include adhering a second coverlay onto the second side of the PCB, similar to the first coverlay described above.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figures 1, 2:
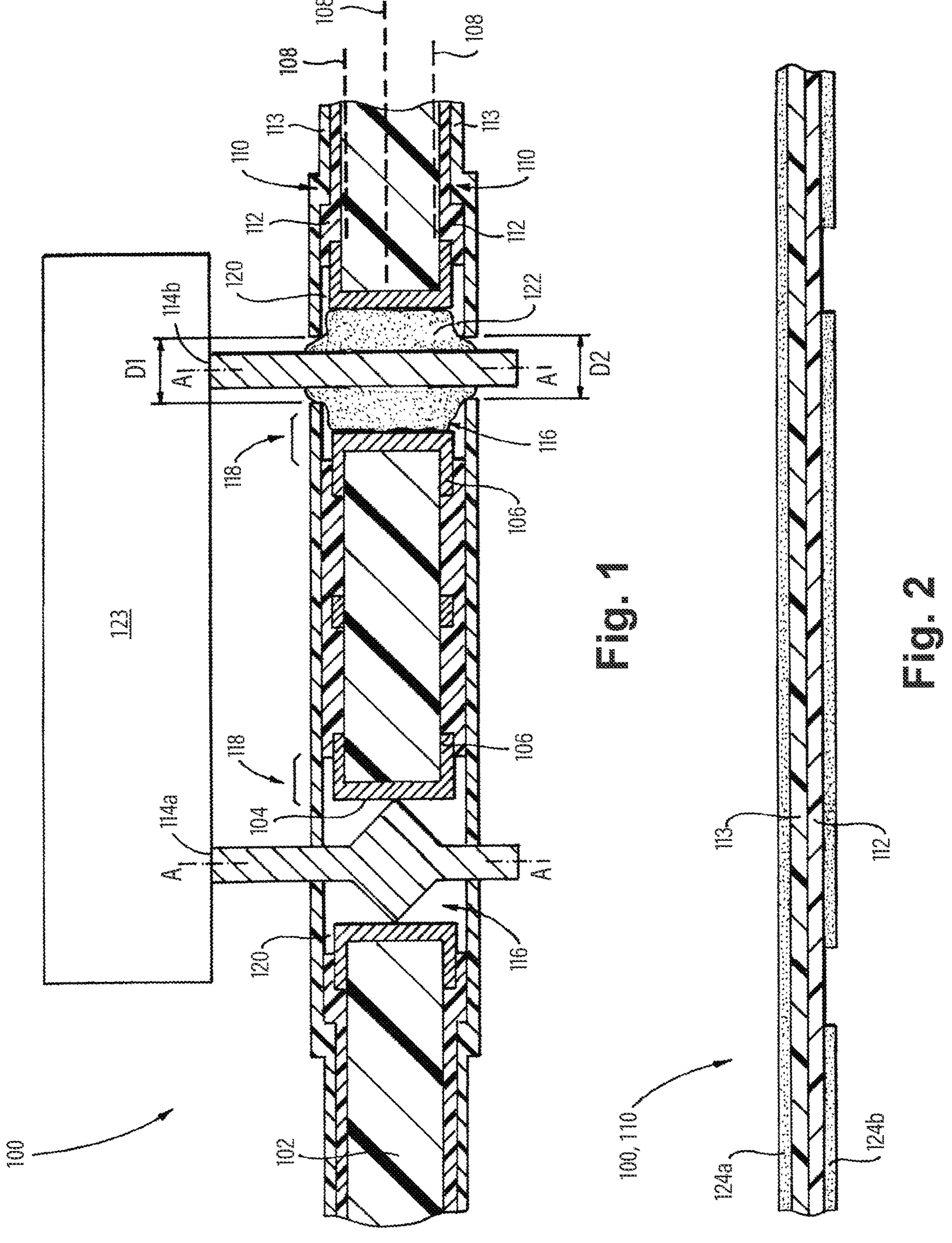
FIG. 1 is a schematic cross-sectional side elevation view of an embodiment of a printed circuit board (PCB) system constructed in accordance with the present disclosure, showing the pin contacts extending through two electrically insulative coverlays.
FIG. 2 is a is a schematic cross-sectional side elevation view of a portion of the system of FIG. 1, showing an adhesive layer on a base dielectric of one of the coverlays.

Reference will now be made to the drawings wherein like reference numerals identify similar structural features or aspects of the subject disclosure. For purposes of explanation and illustration, and not limitation, a partial view of an embodiment of a printed circuit board (PCB) system in accordance with the disclosure is shown in FIG. 1 and is designated generally by reference character 100. Other embodiments of systems in accordance with the disclosure, or aspects thereof, are provided in FIGS. 2-5, as will be described. The systems and methods described herein can be used to provide electrical insulation on PCB systems with tight spacing between contact pins and plated through hole (PTH) pads.

The circuit board system 100 includes a printed circuit board (PCB) 102 having a first side and a second side opposite the first side, i.e. the top and bottom sides as oriented in FIG. 1. A plurality of plated through holes (PTHs) 104 are defined through the PCB 102 from the first side to the second side of the PCB 102. A respective pad 106 is defined at each end of each PTH 104. The PCB 102 includes circuit traces 108 electrically interconnecting among the plurality of PTHs 104, which can be on the first side, second side, or embedded between the first side and second side of the PCB 102 as indicated with broken lines in FIG. 1, for forming PCB circuitry with the components 123 such as resistors, inductors, capacitors, transistors, and the like, connecting to the traces 108 through the pin contacts described below. A coverlay 110 is adhered, i.e. laminated with an adhesive layer 112 to the first side of the PCB 102, e.g. the top as oriented in FIG. 1, for insulating voltages among the plurality of PTHs 104. A second coverlay 110 is similarly adhered or laminated to the second side of the PCB 102, i.e. the bottom as oriented in FIG. 1. The coverlays 110 can be of a polyimide material, or any other suitable material.

A plurality of pin contacts 114*a* and 114*b* are included, each pin contact 114*a* and 114*b* extending through both coverlays 110 and a through bore 116 of a respective one of the PTHs of the plurality of PTHs. None of the adhesive layer 112 (of either coverlay 110) extends into the through bores 116. Each through bore 116 is defined along a respective bore axis A. Each coverlay 110 includes an overhang 118 in each of the plurality of PTHs 104 wherein the coverlay 110 extends radially inward with respect to each bore axis A toward the respective pin contact 114*a* and 114*b* beyond the respective pad 106. The overhang 118 defines a void 120 in the adhesive layer 112 axially between the pad 106 of the PCB 102 and the coverlay 110 relative to the respective bore axis A.

The pin contacts 114*a* are compliant, seated within the respective lining or bore 116 of each PTH 104 with an interference fit. The complaint pin contacts 114*a* can be seated by piercing them through both of the coverlays 110. It is also contemplated that holes for the pin contacts 114*a* can be formed, e.g. by drilling or any other suitable process, prior to seating the pin contacts 114*a* so the pin contacts 114*a* do not have to pierce the coverlays 110. It is also contemplated that the pin contacts 114*b* can be secured within the respective pad 106 lining each PTH 104 a solder joint 122 (only one of which is shown in FIG. 1). Those skilled in the art will readily appreciate that for a given PCB 102, all of the PTHs can be compliant or all of the PTHs can be soldered, although FIG. 1 shows one of each. An opening through the second coverlay 110 for each pad 106 can be made bigger than a corresponding opening through the first coverlay 110, so the diameter D2 of the second cover lay 110 can be larger than the diameter D1 of the first coverlay 110. This allows for solder to be applied through the plurality of second holes, i.e. with diameter D2, to electrically connect the plurality of pin contacts 114*b* to the plurality of pads 106 without thermally compromising the second coverlay 110. The pads lining each PTH of the plurality of PTHs can be spaced apart from one another by as few as 17 thousandths of an inch (0.432 mm) or less.

Figures 3, 4, 5:
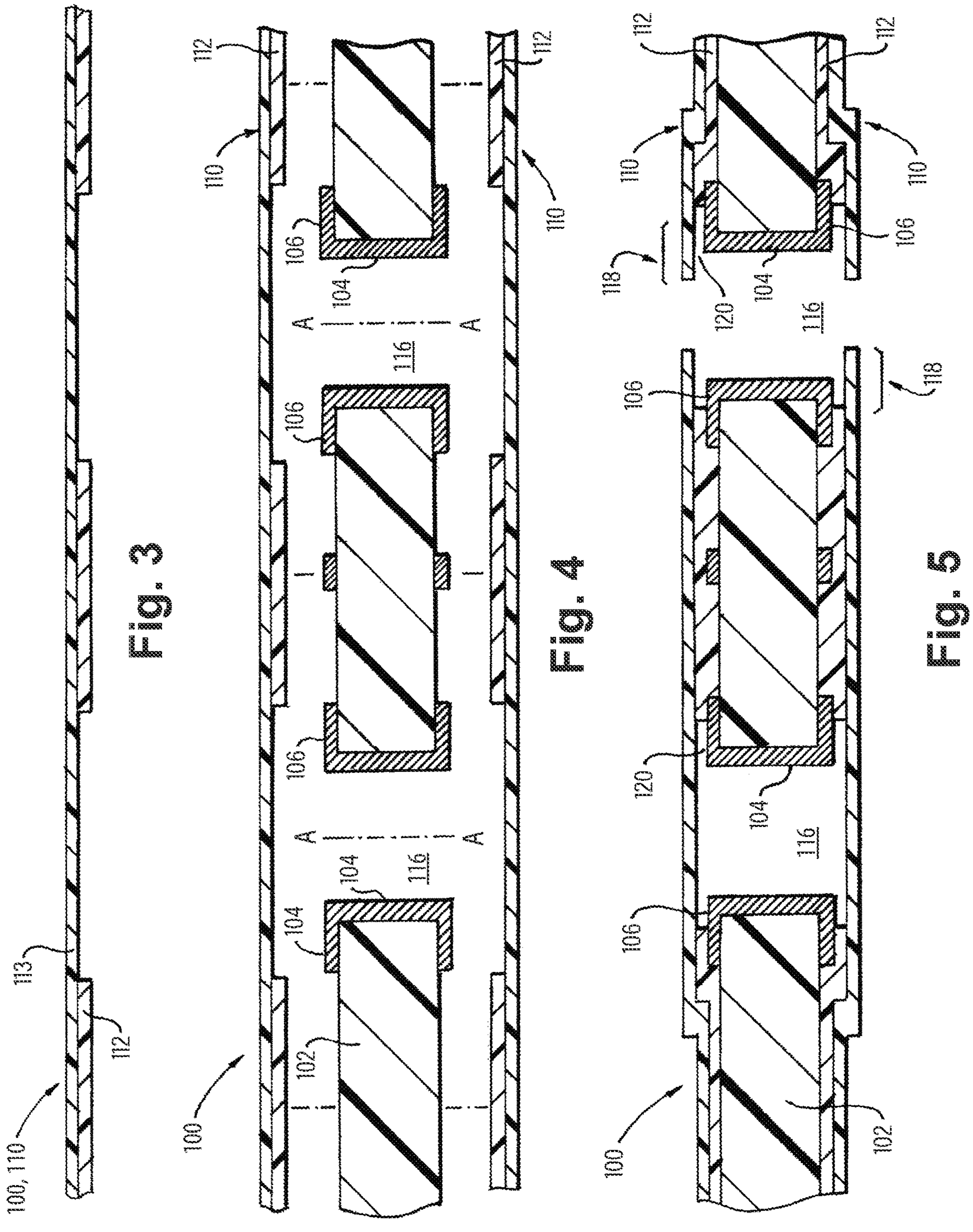
FIG. 3 is a is a schematic cross-sectional side elevation view of a portion of the system of FIG. 1, showing the coverlay of FIG. 2 after selective removal of a portion of the adhesive layer.
FIG. 4 is a is a schematic cross-sectional side elevation view of a portion of the system of FIG. 1, showing two of the coverlays of FIG. 2 being laminated onto the PCB.
FIG. 5 is a is a schematic cross-sectional side elevation view of a portion of the system of FIG. 1, showing two of the coverlays of FIG. 2 laminated onto the PCB.

With reference now to FIG. 2, a method of making a circuit board system 100 as described above includes selectively removing portions of the adhesive layer 112 from a base dielectric 113 of the coverlays 110, only one of which is shown in FIG. 2. Selectively removing portions of the adhesive layer 112 includes applying a patterned photoresist layer 124*b* to the adhesive layer 112 and a solid photoresist layer 124*a* to the base dielectric 113 opposite the adhesive layer 112 wherein the photoresist layer 124 is patterned to leave out the portions of the adhesive layer 112. The portions of the of the photoresist layer 124*b* that are shown removed in FIG. 2 can be removed by imaging a pattern onto the photoresist, and then removing the indicated portion of the photoresist, leaving the pattern in the photoresist layer 124*b* to expose the portions of the adhesive layer 112. Once the imaged pattern portions of the photo resist layer are removed, plasma etching can be used to remove the exposed portions of the adhesive layer 112 from the base dielectric 113. The remaining photoresist layer 124*a* and 124*b* can then be removed from the coverlay 110. The resulting coverlay 110 is shown in FIG. 3, where the pattern is formed in the adhesive layer 112. It is also contemplated that the portions of the adhesive layer 112 can be selectively removed from the base dielectric 113 of the coverlay 110 using controlled depth laser skiving.

With reference now to FIG. 4, after the portions of the adhesive layers 112 have been selectively removed from both coverlays 110, the coverlays 110 can be adhered or laminated onto the first and second sides of the PCB 102, resulting in the structure shown in FIG. 5. Then the pin contacts 114*a* and 114*b* can be seated through the coverlays 110, resulting in the structure shown in FIG. 1.

Systems and methods as disclosed herein provide potential benefits including the following. During lamination, the coverlay adhesive can squeeze out of position and can approach close to but does not encroach into the barrels of the PTHs. This ensures electrical continuity between the contact pins and the PTHs. The coverlay can exist over the entire external plated hole pad surface allowing for the benefits of pin-to-pin and pad-to-pad insulation. The systems and methods disclosed herein can ensure that the coverlay adhesive does not flow into the PTH barrel where it could negatively affect electrical continuity between the connector pin lead and the PTH barrel.

The methods and systems of the present disclosure, as described above and shown in the drawings, provide for insulation on PCB systems with tight spacing between contact pins and plated through hole (PTH) pads. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A circuit board system comprising:

a printed circuit board (PCB) having a first side and a second side opposite the first side, wherein a plurality of plated through holes (PTHs) are defined through the PCB from the first side to the second side;

a respective pad is defined at each end of each PTH of the plurality of PTHs, wherein the PCB includes circuit traces electrically interconnecting among the plurality of PTHs for forming PCB circuitry;

a coverlay adhered with an adhesive layer to the first side of the PCB for insulating voltages among the plurality of PTHs; and a plurality of pin contacts, each pin contact of the plurality of pin contacts extending through the coverlay and a through bore of a respective one of the PTHs of the plurality of PTHs, wherein none of the adhesive layer extends into the through bore, wherein each through bore is defined along a respective bore axis, wherein the coverlay includes an overhang in each of the plurality of PTHs wherein the coverlay extends radially inward with respect to each bore axis toward the respective pin contact beyond the respective pad, wherein the overhang defines a void in the adhesive layer axially between the PCB and the coverlay relative to the respective bore axis.

2. The system as recited in claim 1, wherein the coverlay is a first coverlay and further comprising a second coverlay adhered to the second side of the PCB.

3. The system as recited in claim 2, wherein the second coverlay includes an overhang in each of the plurality of PTHs wherein the coverlay extends radially inward toward the respective pin contact beyond the respective pad.

4. The system as recited in claim 3, wherein the plurality of pin contacts are compliant, seated within the respective lining of each PTH of the plurality of PTHs with an interference fit.

5. The system as recited in claim 3, wherein the plurality of pin contacts are secured within the respective pad lining each PTH of the plurality of PTHs with a solder joint.

6. The system as recited in claim 5, wherein an opening through the second coverlay for each pad is bigger than a corresponding opening through the first coverlay.

7. The system as recited in claim 1, wherein the coverlay is a first coverlay and further comprising a second coverlay adhered to the second side of the PCB.

8. The system as recited in claim 1, wherein the pads lining each PTH of the plurality of PTHs are spaced apart from one another by as few as 17 thousandths of an inch (0.432 mm).

* * * * *